US006946428B2

(12) United States Patent
Rey

(10) Patent No.: US 6,946,428 B2
(45) Date of Patent: Sep. 20, 2005

(54) MAGNESIUM -BORIDE SUPERCONDUCTING WIRES FABRICATED USING THIN HIGH TEMPERATURE FIBERS

(75) Inventor: Christopher Mark Rey, Hockessin, DE (US)

(73) Assignee: Christopher M. Rey, Knoxville, TN (US)

( * ) Notice: Subject to any disclaimer, the term of this patent is extended or adjusted under 35 U.S.C. 154(b) by 156 days.

(21) Appl. No.: 10/425,116

(22) Filed: Apr. 29, 2003

(65) Prior Publication Data

US 2005/0074220 A1 Apr. 7, 2005

Related U.S. Application Data

(60) Provisional application No. 60/379,274, filed on May 10, 2002.

(51) Int. Cl.[7] .......................... H01B 12/00; H01F 6/00; H01L 39/00

(52) U.S. Cl. ...................................... 505/237; 505/238

(58) Field of Search ................................ 505/181, 183, 505/210, 230, 237, 238, 430, 431, 434, 470–477, 500, 704, 739, 866; 33/99 S; 174/125.1; 385/100–103, 123, 126–128

(56) References Cited

U.S. PATENT DOCUMENTS

| | | | | | |
|---|---|---|---|---|---|
| 4,996,192 | A | * | 2/1991 | Fleischer | 505/126 |
| 5,034,373 | A | * | 7/1991 | Smith et al. | 505/432 |
| 5,093,880 | A | * | 3/1992 | Matsuda et al. | 385/100 |
| 5,106,825 | A | * | 4/1992 | Mandigo et al. | 505/431 |
| 5,231,074 | A | * | 7/1993 | Cima et al. | 505/434 |
| 5,292,716 | A | * | 3/1994 | Sakai et al. | 505/126 |
| 5,602,080 | A | * | 2/1997 | Bednorz et al. | 505/451 |
| 5,814,262 | A | * | 9/1998 | Ketcham et al. | 264/316 |
| 5,872,080 | A | * | 2/1999 | Arendt et al. | 505/238 |
| 5,906,964 | A | * | 5/1999 | Chu et al. | 505/230 |
| 5,932,523 | A | * | 8/1999 | Fujikami et al. | 505/231 |
| 5,968,877 | A | * | 10/1999 | Budai et al. | 505/237 |
| 5,972,847 | A | * | 10/1999 | Feenstra et al. | 505/473 |
| 6,154,599 | A | * | 11/2000 | Rey | 385/141 |
| 6,511,943 | B1 | * | 1/2003 | Serquis et al. | 505/300 |
| 6,514,557 | B2 | * | 2/2003 | Finnemore et al. | 427/62 |
| 6,586,370 | B1 | * | 7/2003 | Holcomb | 505/236 |
| 2002/0132739 | A1 | * | 9/2002 | Kang et al. | 505/123 |
| 2002/0173428 | A1 | * | 11/2002 | Thieme et al. | 505/100 |
| 2002/0189533 | A1 | * | 12/2002 | Kim et al. | 117/101 |
| 2002/0198111 | A1 | * | 12/2002 | Tomsic | 505/230 |

FOREIGN PATENT DOCUMENTS

| | | | |
|---|---|---|---|
| JP | 63299011 | * | 12/1988 |
| JP | 03114011 | * | 5/1991 |
| WO | WO 02/069353 A1 | * | 9/2002 |

OTHER PUBLICATIONS

Zhao et al., "Nanoparticle structure of MgB2 with ultrathing TiB2 grain boundaries", Mar. 4, 2002, Appl. Phys. Lett., vol. 80, No. 9, pp. 1640–1642.*

Zhao et al., "Doping effect of Zr and Ti on the critical current density of MgB2 bulk superconductors prepared under ambient pressure" Oct. 2002, Physica C 378–381, pp. 122–126.*

* cited by examiner

*Primary Examiner*—Colleen P. Cooke

(57) ABSTRACT

This invention uses a novel approach for the fabrication of low temperature superconducting (LTS) magnesium di-boride ($MgB_2$) wire or cable. This approach employs the use of a "high temperature fiber or tape" as a high performance substrate material. High temperature fiber substrates are low-cost, round, light-weight, non-magnetic, and capable of withstanding, without degradation, the high reaction temperatures necessary to form the superconducting phase of Mg—B.

16 Claims, 3 Drawing Sheets

MgB2 Wire or Tape

MgB2 Wire or Tape

Mg-B Thin Film Deposition w/IBAD

Mg-B Film Deposition Flow Chart

MAGNESIUM -BORIDE SUPERCONDUCTING WIRES FABRICATED USING THIN HIGH TEMPERATURE FIBERS

This application claims the benefit of Provisional Application No. 60/379,274, filed May 10, 2002.

FIELD OF THE INVENTION

This invention relates to the use crystalline, polycrystalline, metallic, and amorphous fibers and tape for use as a substrate material in the fabrication of low cost, light weight, long length, low temperature superconducting magnesium di-boride ($MgB_2$) wire, tape or cable, using thick or thin film deposition techniques. These fibers or tapes are capable of withstanding extremely high reaction temperatures without degradation (typically >600 degrees C.), while remaining chemically inert. These fibers or tapes will here on be referred to as "high temperature fibers/tapes."

Nomenclature Used in Text

CTE Coefficient of Thermal Expansion
CVD Chemical Vapor Deposition
HTS High Temperature Superconductor
IBAD Ion Beam Assisted Deposition
ISD Inclined Substrate Deposition
$I_c/J_c$ Critical Current/Density of a Superconductor
LTS Low Temperature Superconductor
PACVD Photo Assisted Chemical Vapor Deposition
PIT Powder-in-Tube
PLD Pulsed Laser Deposition
PVD Plasma Vapor Deposition
Re Rare Earth
RF/DC Radio Frequency/Direct Current
RABITS Rolling Assisted Bi-axially Textured Substrates Symbols Used in Text Ag Silver
Al Aluminum
$Al_2O_3$ Alumina/Sapphire
B Boron
Ba Barium
Bi Bismuth
Ca Calcium
Ce Cerium
Cu Copper
Ge Germanium
Hg Mercury
La Lanthanum
Mg Magnesium
Ni Nickel
Nb Niobium
O Oxygen
Pb Lead
Pd Palladium
Ru Ruthenium
SiC Silicon-Carbide
$SiO_2$ Silica/Silcon di-oxide/Quartz
Sn Tin
Ta Tantalum
Ti Titanium
Tl Thallium
WC Tungsten carbide
Y Yttrium
Zr Zirconia

BACKGROUND

General

The phenomenon of superconductivity was discovered in 1908 by Dutch Physicist Kamberlign Onnes, while studying the electrical resistance properties of pure mercury at very low temperatures. A superconducting material is one that when cooled below its critical transition temperature ($T_c$) will lose all it measurable electrical resistance. In 1933, Meissner and Oschenfield discovered that superconductors not only have zero electrical resistance, but also behave like perfect diamagnets. Superconductors are classified into two categories depending upon their magnetization properties. In an applied magnetic field, Type-I superconductors undergo a reversible thermodynamic transition from the perfectly diamagnetic superconducting state to the normal resistive state. Type II superconductors undergo two irreversible thermodynamic transitions. The first occurs at a lower critical field $H_{c1}$, and is a transition from a perfectly diamagnetic superconducting state to a "mixed" or vortex state. The second occurs at an upper critical field $H_{c2}$, and is a transition from the mixed state to the resistive normal state. In the mixed state, quantized units of magnetic field known as fluxoids are allowed to penetrate the superconducting material, while the bulk material maintains its diamagnetism. When a superconducting material is in its mixed state with fluxoids penetrating the material and a transport current is passed through the material, a Lorentz force is developed between the fluxoid and the transport current. If the fluxoid in not "pinned" to the superconducting material then it will move under this Lorentz force causing unwanted dissipation. A key to fabricating a practical superconducting is to have the "pinning" force large enough to withstand the Lorentz force from significant current flow. There are several known methods to increase pinning forces in superconductors each pertaining to the introduction of defects into the materials. Some known methods include physical defects, chemical defects, irradiation, etc., and can be found in prior artwork: U.S. Pat. No. 4,996,192 by Fleisher et al., 2) U.S. Pat. No. 5,034,373 by Smith et al., and U.S. Pat. No. 5,292,716 by Saki et al.

For any superconducting material there is a maximum or critical current density ($J_c$) that the material is able to conduct, a maximum or critical magnetic field ($B_c$) that can be applied, and a maximum or critical temperature ($T_c$) that the material can experience, without developing resistance. These three critical parameters of a superconductor are all interrelated and each play a crucial role in developing a practical material that can be used in real world applications. For example, in an externally applied magnetic field (H), the critical current density $J_c$ (T, H) of a superconductor will decrease with increasing applied field. Similarly, the critical current density $J_c$ (T, H) will decrease with increasing temperature up to the transition temperature $T_c$, where the material will revert back to its normal state. Once again, for practical applications where high critical current density is required, it is important to increase the pinning forces through the introduction of defects such as chemical doping, irradiation, or other physical deformation. For superconducting materials that possess anisotropic superconducting properties, it is additionally important to have a high degree of crystal texture to minimize "weak links" which can develop between the grain boundaries (see section below and claim 1).

High Temperature Superconductors and Low Temperature Superconductors

Until the 1986, all known superconducting materials had critical transition temperatures below~23 K. This class of superconductors is commonly referred to as Low Temperature Superconductors (LTS) and typically consist of many metallic and inter-metallic compounds (e.g. Nb, Va, Hg, Pb, NbTi, $Nb_3Sn$, $Nb_3Al$, $Nb_3Ge$, etc.). The fundamental quantum physics that governs all LTS materials is based on phonon mediated superconductivity.

In 1986, a new class of materials based upon oxide superconductors was discovered. This class of materials had significantly higher transition temperatures. They are commonly referred to as High Temperatures Superconductor (HTS) with some examples including (Re)—Ba—Cu—O, Bi—Sr—Ca—Cu—O, (Bi, Pb)—Sr—Ca—Cu—O, Tl—Ba—Ca—Cu—O, and Hg—Sr—Ca—Cu—O. The fundamental quantum physics that governs HTS materials is still not yet known.

Magnesium Di-boride

Superconductivity in the compound magnesium di-boride ($MgB_2$) was recently discovered in February 2001. $MgB_2$ has a superconducting transition temperature ($T_c$) of ~39 K in zero applied field. $MgB_2$ is difficult to classify as an LTS or HTS material based upon its transition temperature alone. From the technical literature, $MgB_2$ appears to have a significant isotope effect, indicating a phonon mediated superconducting mechanism. Thus, $MgB_2$ appears to be the ultimate strong coupling LTS material. The $MgB_2$ material is crystalline/polycrystalline in nature and requires very high reaction temperatures, typically >600° C., to form the superconducting phase. The superconducting phase of this material has a hexagonal crystal structure. Unlike many of the metallic and inter-metallic LTS superconductors, which have isotropic superconducting properties, $MgB_2$ has anisotropic superconducting properties. In this sense, $MgB_2$ is similar to HTS materials, which possess highly anisotropic superconducting properties. Although it is still quite early in the development of practical $MgB_2$ wire or cable, it appears that the highest quality, highest critical current material is obtained when $MgB_2$ has some reasonable crystallographic alignment. Unlike its HTS counter-part which needs nearly perfect epitaxy to carry significant amounts of current, $MgB_2$ requires some degree of texture of the crystal axis. This invention exploits this with the use of appropriate high temperature fiber substrates and (optional) buffer layer materials to obtain crystallographic alignment. One of the most critical factors in producing high quality, high $J_c$ material is having good c-axis alignment of the $MgB_2$ crystal.

Most of the early research on the $MgB_2$ compound has been in the form of chemical doping to alter the superconducting properties (i.e. $T_c$, $J_c$, and $B_c$). Fortunately, the invention by Rey can is quite versatile and can implement the highest quality magnesium di-boride compound and any potential future chemically doped variants.

First Generation Bi-Oxide Conductors

First generation HTS wire and tape has been primarily limited to the Bi-oxide family because of its superior texturing properties. First generation, Bi-oxide based HTS wire and tape is almost exclusively fabricated with traditional "metallurgical" processes. The most common metallurgical process used to fabricate Bi-oxide wire and tape is the power-in-tube (PIT) method (see for example U.S. Pat. No. 5,106,825 by Mandigo et al.). However, there are several disadvantages to the PIT approach. The PIT method is expensive to fabricate and difficult manufacture. A typical figure of merit for a first generation Bi-oxide PIT wire or tape ranges from $50 to $300 per kA-m. The desired figure of merit is for any HTS wire is <$10 per kA-m. A fundamental limitation of the PIT approach is the use of silver or silver alloys as the containment medium. These materials, while chemically compatible, are expensive (~$3–5 per kA-m) relative to the ultimate desired cost of the superconducting wire. The primary technical obstacle to practical implementation of the first generation Bi-oxide based material is its relatively moderate current carrying capacity at elevated temperatures (>60 K) and high magnetic fields (>1 T). The practical use of the Bi-oxide material appears to be intrinsically limited to lower temperatures (<40 K), low bending strains (<0.2%) and low magnetic fields (<2–3 T).

Another subtler disadvantage of this approach is the use of a substrate with planer (i.e. flat) geometry. Substrates with planer (flat) geometry suffer from two inherent disadvantages. First, they have higher eddy current loss when a magnetic field is applied perpendicular the face of the tape. This situation is unavoidable in many applications. Second, they generate a non-uniform self magnetic field. This will result in non-uniform current distribution in the superconducting material. Non-uniform current distributions result in an inefficient current flow, and thus, an uneconomical use of the superconducting material.

HTS Thin Films on Rigid Crystal Wafers

Until 1996, most HTS films were fabricated using traditional thick and thin film techniques for use in high frequency electronic device applications. Typical thick film techniques include sol-gel, dip coating, spin coating, electroplating, etc. Typical thin film techniques include rf/dc sputtering, co-evaporation, CVD, PVD, laser ablation, etc. Using these known film deposition techniques, very high quality HTS films with $J_c>10^6$ A/cm$^2$ (77 K, self-field) were fabricated (see for example U.S. Pat. No. 5,231,074 by Cima et al). The primary reason for this success was that the HTS films were deposited on single crystal substrates that possessed a "natural" textured crystal structure orientation. Some typical single crystal substrates that have been used successfully to deposit texture HTS films are: sapphire ($Al_2O_3$), magnesium oxide (MgO), lanthanum aluminate ($LaAlO_3$), strontium titinate ($SrTiO_3$), as well as several others. The key to high quality HTS films once again being this natural highly oriented crystal structure template. By depositing the HTS films on highly oriented crystalline substrate templates, the HTS crystals themselves could grow in a highly textured format. With this high degree of crystal texture, HTS films will carry in excess of >$10^6$ A/cm$^2$ at 77K, self-field. When HTS crystals are randomly aligned i.e. polycrystalline, they will have extremely low critical current densities. Low critical current densities are not useful in most real world device applications. For example, when HTS material is deposited on polycrystalline (i.e. no texture) metallic substrates (e.g. Ni, or Ni alloy), the result is a very poor quality HTS film with very low $J_c$'s. Although high quality, high $J_c$ HTS films could be grown quite readily on rigid crystalline substrates for use in electronic device applications (e.g. cavities, high frequency filters, mixers, etc.), they could not be fabricated into long lengths, which are necessary for most magnet applications (e.g. motors, generators, magnets, transformers, cables, etc.).

The goal for HTS conductors has been to reproduce the excellent superconducting properties obtained on the rigid crystalline wafers on a flexible substrates. U.S. Pat. No. 5,814,262 by Ketcham et al. teaches the process of fabricating thin inorganic sintered structures having strength and flexibility sufficient to permit bending without breakage in at least one direction to a radius of curvature of less than 20 centimeters.

Second Generation Coated Conductors

Oxide based HTS materials tend to have strong spatial anisotropic critical current and critical magnetic fields, while most of the metallic/inter-metallic LTS materials tend to have isotropic critical current and critical magnetic field properties. The existence of this strong anisotropy in HTS materials has led the development of very specific fabrication methods, including the second generation coated conductors. Second generation coated conductors use external means (i.e. not natural crystal structure) to introduce texturing to a substrate template. Films of non-superconducting buffer layers and superconducting layers are deposited in a highly controlled environment onto this textured substrate template for the specific purpose of subsequently growing HTS films with a high degree of in-plane crystal orientation. There are several known methods used to fabricate second generation HTS coated conductor including: rolling assisted bi-axial textures substrates (RABiTS), ion assisted beam deposition (IBAD), inclined substrate deposition (ISD), etc.

In 1996, researchers began to introduce thick/thin film deposition methods for fabricating long length coated conductors on flat (polycrystalline) metallic substrates. The metal of choice was typically Ni or one of its alloys, because of its ability to tolerate the high reaction temperature (>700° C.) necessary for HTS phase formation, yet remain chemically inert. Typically, metals have a polycrystalline order and directly depositing HTS materials on them would result in poor quality, low $J_c$ films. The key to fabricating high quality, high $J_c$ material on metallic substrates was the imparting of an "external" texturing means to either the template itself (e.g. RABiTS) or imparting a texturing means by the deposition process itself (e.g. IBAD, PACVD, ISD, ITEX). Several of the known methods for imparting texture to the HTS materials (IBAD, RABiTS, PACVD, ISD, ITEX), are known to produce high quality, high $J_c$ coated conductor.

Applications of Superconducting Wire

Copper, aluminum, and magnetic iron are the primary conventional materials of devices used in today's electrical power sector. A long time challenge in the electrical power industry has been to make practical, economic superconducting wire. There are several potential applications of superconducting wire in the electric power industry including: ac/dc transmission cables, ac/dc motors, magnets, transformers, generators, energy storage devices (SMES), fault current limiters (FCL's), etc. Superconducting wire also has applications is several other industrial applications as well including: MRI, NMR, magnetic separation, waste remediation, particle accelerators, fusion reactors, ship propulsion, etc.

SUMMARY OF THE INVENTION

Current Carrying Element

In one embodiment, the basic current carrying element consists of a multi-layer film of Mg—B deposited on a non-superconducting high temperature fiber or tape. The non-superconducting high temperature fiber or tape (e.g. SiC, $Al_2O_3$, $SiO_2$, tungsten carbide, metallic wire or tape of Ti, Ni, Ag, Cu, Pt, Fe, etc.) acts as a template for the overlying coatings. The choice of the non-superconducting fiber is crucial. It must be able to withstand the extremely high reaction temperature necessary to form the superconducting phase, while remaining chemically inert. It must provide a good template to promote c-axis growth of the Mg—B superconductor. It must have a reasonable crystal lattice constant match and should have similar CTE to reduce thermal and mechanical strain over the entire temperature range. The multi-layer deposition is performed using one of the known thick film (e.g. sol-gel, dip-coat, spin coat, electroplate, spray pyrolisis, etc.) or thin film (e.g. CVD, PVD, PLD, co-evaporation, RF/DC sputtering, e-beam, etc.) deposition techniques. To further enhance performance, this deposition may be coupled with one of the known external crystal texturing techniques (e.g. RABiTS, IBAD, ISD, etc.).

In one embodiement, the multi-layer film may use a non-superconducting buffer layer or layers between the high temperature fiber or tape template and the Mg—B film. This (optional) buffer layer may be used to promote textured grain alignment, reduce the mechanical stress, improve the CTE mismatch, improve chemical compatibility, and promote better crystal lattice matching of the Mg—B film (see for example U.S. Pat. No. 5,602,080 by Bednorz et al.). Typical non-superconducting oxide buffer layers include (but are not limited to): ZrO, CeO, $Gd_2O_3$, YSZ, MgO, SiC, $Al_2O_3$, $Y_2O_3$, La-Mn, etc. Typical metallic buffer layers include (but are not limited to): Ag, Au, Cu, Pd, Pt, Ni, Fe, Ru, etc. (see for example U.S. Pat. No. 5,093,880 by Matsuda et al. "Optical Fiber Cables Comprising Carbon- and Metal-Coated Optical Fibers and their Manufacture"). If a conducting buffer layer is used to promote grain alignment, reduce thermal and mechanical strain, etc. it may also have the additional function of providing electric and/or thermal stability. On top of the superconducting Mg—B layer, a noble metallic coating (e.g. Cu, Ag, Al, Au) is deposited using one of the known thick/thin film deposition techniques. The noble metallic coating is used to provide electric and thermal stability during normal superconducting operation, and provides additional protection by reducing voltage stress, thermal runaway, and low electrical resistance by-pass, in the event that the superconducting material returns to a resistive state. The thickness of the noble metallic coating will vary according to the application, but typically will be <1–10 microns. On top of the noble metallic coating is an additional insulating coating. The insulating coating serves two purposes. First, it electrically isolates one fiber or tape in the stack of conductors from the other. Second, it provides an additional protective coating to keep the film from getting damaged or degrading as a result of exposure to the environment. The thickness of the dielectric insulating coating will vary according to the application, but typically will be <1–10 microns. The non-superconducting layers consisting of the noble metallic coating and the electrical insulator are sometime referred to as "cap" layers (see FIG. 1). The entire multi-layer film (i.e. coated conductor) make up the basic current carrying element of this invention.

Crystal Structure

It is important to recognize the importance of the underlying crystal structure of both the non-superconducting high temperature fiber and the (optional) non-superconducting buffer layer or layers. The high temperature fiber substrate and the buffer layer are used to promote textured growth of the overlying $MgB_2$ superconductor. In particular, it is important to choose a substrate or buffer layer(s) that has a similar CTE and crystal structure as the $MgB_2$ crystal. The $MgB_2$ crystal has a hexagonal structure, examples of suitable high temperature fibers include (SiC, WC, $Al_2O_3$, Ti, etc.). A suitable buffer layer(s) with the appropriate crystal structure and lattice match must also be chosen. The net result is that the $MgB_2$ crystal must have a good c-axis alignment and reasonable in-plane texture. Failure to choose the correct high temperature fiber template and non-superconducting buffer layer will result in a non-practical Mg—B wire.

Chemical Doping

In one embodiment, the basic current carrying multi-layer fiber or tape film consists of a doped compound of Mg—B. Chemical substitution/doping has been investigated extensively in the Mg—B compound in order to study and possibly enhance its superconducting properties (i.e. $T_c$, $B_c$, and in particular $J_c$ (T, H). Possible doping elements include (but are not limited to) silicon carbide, titanium, boron nitride, tungsten carbide, niobium, vanadium, tantalum, germanium, zirconium, calcium, iron, cobalt, nickel etc. To date, the most success at enhancing the current carrying capacities has been with Ti and SiC substitutions. Any of the doped Mg—B compounds can be used to produce the basic current carrying element of this invention (i.e. a multi-layer fiber film).

Bundling of the Current Carrying Elements

In one embodiment, the basic current carrying elements (i.e. multi-layer high temperature fiber or tape film) are stacked together to form a multi-filament conductor. The multi-filament conductor can then be further bundled to for a multi-strand cable (see for example U.S. Pat. No. 5,932,523 by Fujikami et al.). For the tape configuration, it is best to use as low as aspect ration (width to thickness) as possible to minimize ac loss and reduce self-field effects. It is also important to twist and fully transpose the fibers in order to reduce the ac loss.

The current carrying capacity of the multi-filament conductor is determined by several factors including: a) the number of current carrying elements/fibers/tapes, b) the thickness of the superconducting coating, c) the critical current $J_c$ (T,H) of the Mg—B coating, and d) the inclusion and placement of physical and/or chemical defects to enhance the pinning force.

Advantages

The invention by Rey has several advantages over any of the existing prior art work The invention by Rey takes advantage of the all the recent progress that has been made concerning the fabrication of second generation HTS coated conductor to fabricate multi-layer Mg—B superconducting wire.

Light-Weight with High Tensile Strength

Non-metallic high temperature fiber or tape substrates (e.g. sapphire, silica, SiC, etc.) have many practical implementation advantages over existing metallurgical techniques now being investigated. They are extremely mechanically rugged and lightweight, with relatively high tensile strengths and bending strains. Lightweight fibers with high tensile strengths will introduce greater practicality in the fabrication of commercial devices by reducing support structural requirements. This in turn will reduce the fabrication cost and promote greater commercial viability. Silica and sapphire fiber for example, at room temperature have densities of 2.4 g/cm$^3$ and 3.9 g/cm$^3$ and tensile strengths in excess of 1 GPa and 2–4 GPa, respectively.

Non-Magnetic

Most non-metallic fibers (e.g. silica, SiC, tungsten carbide, and sapphire) and some metallic fibers and tapes (e.g. Ag, Au, Pt, Cu, Ti, etc.) and are non-magnetic in nature. In many practical applications, a magnetic substrate is deleterious because of the tendency to screen the magnetic flux from the desired location and concentrate it on the conductor itself. This can lower the overall $J_c$ of the conductor and sometimes disrupt magnetic field homogeneity. The flat metallic nickel substrates used presently in IBAD and RABiTS process are highly magnetic.

Flat vs. Round

Most high temperature fibers have circular symmetry. Substrates with circular symmetry have the advantage of uniform self-magnetic field when transmitting current. A uniform self-field translates to a uniform current distribution and thus an efficient use of superconducting material and in applications can have a high magnetic field homogeneity. Flat tape substrates do not have this capability. For the flat tape substrate it is important to lower the aspect ration (width to thickness) to reduce ac loss and unwanted self-field effects.

Fabrication of Mg—B round wires using traditional metallurgical approaches (e.g. PIT, CTFF, etc.) have been plagued with problems due to the lack of grain alignment of the Mg—B material. Because of its anisotropic properties, randomly aligned grains do not produce high quality, high current carrying capacity conductor. To date, the most successful Mg—B conductor fabrication has been with flat metallic tape. Flat metallic tape can be rolled and pressed to promote grain alignment of the Mg—B material. Thi is similar to the Bi-oxide HTS compound. The advantage of the invention by Rey is that the Mg—B material is grown on a round high temperature fiber substrate that promotes textured growth of the over-lying Mg—B material. The resulting textured material is fabricated using one of two methods: a) the natural crystal structure of the underlying substrate (e.g. SiC, $Al_2O_3$, Ti, etc.) and possibly an optional buffer layer and/or b) an external texturing means such as RABiTS, IBAD, PACVD, or ISD.

AC Loss

Superconducting wires, tapes or cables made with high temperature fiber or tape substrates can have significantly lower losses when used in ac applications. The reasons are as follows: 1) the electrically insulating nature of the (non-metallic) high temperature fiber substrate can minimize eddy current loss in the substrates itself; 2) Most non-metallic and some metallic high temperature fibers are non-magnetic (see also Section 5.2.6). This will reduce the magnetic coupling losses between the substrate and the superconducting material; 3) high temperature fibers can be readily made with very small filament diameters (approximately a few microns). Hysteresis loss is proportional to the superconductor filament diameter, hence the smaller the diameter, the smaller the hysteresis loss; 4) most high temperature fibers have circular cross section and can readily be twisted and transposed at both the filament level and cabling level. Twisting and transposing both filaments and wires will be essential for successful ac applications. Flat substrates cannot be easily twisted or transposed.

Optical Transmission

If the high temperature fiber substrate is specifically an optical fiber (e.g. optically transparent silica or sapphire) it may have a plural use as both traditional optical fiber used in optical data transmission and/or a superconducting wire for electrical current carrying devices (see for example: a) U.S. Pat. No. 6,154,599 by Rey, b) U.S. Pat. No. 4,842,366 by Swada et al., c) JP 03114011 A by Showa Electric Wire Co., d) JP 63299011 A by Kiyofuji et al, and d) JP 03114011 by Nakamura et al. Sapphire optical fiber is particularly promising because it has a similar crystal structure and therefore promotes c-axis alignment of the overlying Mg—B superconducting layer.

Ease of Implementation Using Existing Equipment & Infrastructure

High temperature fibers have a demonstrated ability to be cabled into large bundles. For superconducting current carrying applications, this would translate to increased current carrying capacity. Twisted and transposed wire bundles would be necessary for ac applications.

Crystal Nature/Glass-Like Nature

The crystal/glass-like nature of the (non-metallic) high temperature fibers and their ability to withstand the high reaction temperatures (>600 degrees C.) during the formation of the superconducting phase, while remaining chemically inert, is highly desirable. In addition, several of the high temperature fiber substrates such as Ti, Ta, Zn, SiC, $Al_2O_3$ (sapphire) have hexagonal crystal structures. As mentioned previously, the $MgB_2$ material is anisotropic in nature and the highest quality material has been reported in textured samples. Having a suitable crystalline substrate will promote textured growth of the Mg—B material and reduce any potential problems from non-aligned crystals.

In-Situ and Ex-Situ Fabrication

Mg—B based superconducting material can be fabricated using both a one-step "in-situ" and a two-step "ex-situ" deposition technique. A one-step in-situ process consists of depositing the Mg—B coating on a heated high temperature fiber substrate. A two-step ex-situ process consists of depositing the Mg—B coating at a cooler temperature (e.g. room temperature) and subsequently heating and annealing to form the correct superconducting phase.

RELATED ARTWORK

This invention builds upon prior artwork to culminate in an invention that is significantly superior to previous artwork.

U.S. Pat. No. 5,968,877, U.S. Pat. No. 5,906,964, U.S. Pat. No. 5,872,080 and U.S. Pat. No. 5,972,847

There are four recent patents that are cited as relevant to the proposed invention: 1) Budai et al. (U.S. Pat. No. 5,968,877→October 1999), 2) Chu et al. (U.S. Pat. No. 5,906,964→May 1999), 3) Arendt et al. (U.S. Pat. No. 5,872,080→February 1999), and 4) Feenstra et al. (U.S. Pat. No. 5,972,847→October 1999. All four of these patents deal with the deposition of HTS materials and non-superconducting buffer layers on flat metallic nickel substrates using either the PACVD, RABiTS or IBAD deposition process for the purpose of fabricating long length coated conductor. The two primary differences of these patents and the invention by Rey are the different substrates and the different superconducting material. U.S. Pat. No. 5,968,877, U.S. Pat. No. 5,906,964, U.S. Pat. No. 5,872,080 and U.S. Pat. No. 5,972,847 use a flat metallic Ni or Ni alloy substrate. The invention by Rey uses a high temperature crystalline, polycrystalline, metallic or amorphous fiber. U.S. Pat. No. 5,968,877, U.S. Pat. No. 5,906,964, U.S. Pat. No. 5,872,080 and U.S. Pat. No. 5,972,847 deal strictly with HTS oxide superconductors. The invention by Rey deals with Mg—B compounds.

U.S. Pat. No. 6,514,557

The patent application by Rey cites the related prior artwork of U.S. Pat. No. 6,514,557 by Finnemore at al. Although the previous artwork pertains to the fabrication of $MgB_2$ superconductor it differs greatly in fabrication and function from the application by Rey. In U.S. Pat. No. 6,514,557 a superconducting $MgB_2$ filament is fabricated from starting boron filament and subsequently introduces magnesium at a given temperature and pressure prescription to form a superconducting filament a magnesium diboride. Thus, for U.S. Pat. No. 6,511,943 the resulting filament is SUPERCONDUCTING. The application by Rey is far different in that a NON-SUPERCONDUCTING high temperature fiber (e.g. Ti, SiC, Aluminum oxide, etc.) is coated with magnesium di-boride film using one of the well known thick film (dip coating, sol-gel, spray/spin coat, etc.) or thin film (CVD, RF/DC sputter, e-beam, PLD, etc.) deposition techniques. The fiber in the application by Rey is NON-SUPERCONDUTCING and must be able to handle the extremely high reactions temperatures to form the $MgB_2$ superconducting phase. Furthermore, the fiber in the application by Rey most promote good grain alignment and was specifically chosen to be of a similar crystal structure (hexagonal) as the $MgB_2$ to promote textured crystal growth of the $MgB_2$. The application by Rey deals with the manufacture of a superconducting wire or cable comprising a high temperature (non-superconducting) fiber. Thus, items critical for wire manufacture must be included such as: a) buffer layers to minimize mechanical stress and CTE mismatch between the underlying fiber, b) noble metallic coatings for thermal and electrical stabilization, c) dielectric coating for electrical insulation and environmental protection, d) twisting and transposing for reduction of ac loss, e) high mechanical strength, etc. Without these essential features, the superconducting wire has no practical value.

U.S. Pat. No. 6,511,943

The patent application by Rey cites the related prior artwork U.S. Pat. No. 6,511,943 by Serquis et al. Although the previous artwork pertains to the fabrication of $MgB_2$ superconductor it differs greatly in fabrication and function from the application by Rey. U.S. Pat. No. 6,511,943 by Serquis is a method for forming a superconducting powder of magnesium di-boride. It is not related to the manufacture of superconducting wire or cable. The application by Rey is far different in that a NON-SUPERCONDUCTING high temperature fiber (e.g. Ti, SiC, Aluminum oxide, etc.) is coated with magnesium di-boride film using one of the well known thick film (dip coating, sol-gel, spray/spin coat, etc.) or thin film (CVD, RF/DC sputter, e-beam, PLD, etc.) deposition techniques. The fiber in the application by Rey is NON-SUPERCONDUTCING and must be able to handle the extremely high reactions temperatures to form the $MgB_2$ superconducting phase. Furthermore, the fiber in the application by Rey most promote good grain alignment and was specifically chosen to be of a similar crystal structure (hexagonal) as the $MgB_2$ to promote textured crystal growth of the $MgB_2$.

US 20020132739

The patent application by Rey cites the related prior patent application US 20020132739 by Kang et al. Although the previous artwork pertains to the fabrication of $MgB_2$ superconducting films it differs greatly in fabrication and particularly in the function from the application by Rey. The patent application US 20020132739 by Kang et al. deals strictly with the fabrication of $MgB_2$ films for microelectronic devices such as "a rapid single flux quantum" circuit (RSFQ), superconducting quantum interference device (SQUID), Josephson junctions, etc. This is very different than the application by Rey in which the primary function is a superconducting wire or cable comprising a high temperature fiber. There are no similarities in their function. The patent application US 20020132739 by Kang et al. does use a similar fabrication process as the application by Rey. US 20020132739 does employ a crystalline substrate of mono-crystalline sapphire (claim 7, US 20020132739) or strontium titanate, however, these substrates are rigid crystalline wafers. They are not flexible high temperature fibers (e.g. SiC, silica, Ti, sapphire, etc). Note, the sapphire fiber used in the application by Rey need not be limited to mono-crystalline (claim 7, US 20020132739) but could also be polycrystalline. The inclusion of polycrystalline sapphire is a very important distinction in terms of relative cost, mechanical strength, flexibility, and crystal growth. The application US 20020132739 by Kang et al. does use similar thin film (not thick film) deposition techniques (claim 2, US 20020132739) and does recognize the importance of c-axis orientation of the $MgB_2$ crystal (claim 8, US 20020132739. It does not, however, recognize the importance of a buffer layer template for CTE mismatch, lattice match, or general strain relief.

US 20020189533

The patent application by Rey cites the related prior patent application US 20020189533 by Kim et al. Although the previous artwork pertains to the fabrication of $MgB_2$ superconducting films it differs greatly in fabrication and particularly in the function from the application by Rey. The patent application US 20020189533 by Kim et al. deals strictly with the fabrication of $MgB_2$ films for micro-electronic devices such as "a rapid single flux quantum" circuit (RSFQ). This is very different than the application by Rey in which the primary function is a superconducting wire or cable comprising a high temperature fiber. There are no similarities in their function. The patent application US 20020189533 by Kim et al. does use a similar fabrication process as the application by Rey. The patent application US 20020189533 by Kim et al. does employ a non-superconducting substrate, a non-superconducting buffer layer template and recognizes the importance of textured/epitaxial growth of the $MgB_2$ crystals. Similar to the application by Rey, US 20020189533 by Kim et al. also recognizes the importance of the hexagonal crystal structure of both the substrate and the template and crystal lattice matching of the superconducting film to that of both the substrate and the buffer layer template. The key difference in the $MgB_2$ film fabrication process is that the patent application by Kim (claim 5) is that it is perform on a rigid crystal substrate (e.g. ZnO, GaN, GaAs, MgO, etc.). It is NOT performed on a flexible (twistable and transposable) fiber.

For the application by Rey, items critical for wire manufacture must be included to make a practical wire or cable such as: a) noble metallic coatings for thermal and electrical stabilization, b) dielectric coating for electrical insulation and environmental protection, c) twisting and transposing for reduction of ac loss, d) high mechanical strength, e) multi-filament type structure for low hysteretic ac loss, f) introduction of pinning centers via ion bombardment, chemical doping (e.g. SiC, Ti, etc, or mechanical deformation in order to enhance critical current values, etc. Without these essential features, the superconducting wire has no practical value.

US 20020198111

The patent application by Rey cites the related prior patent application US 20020198111 by Tomsic. Although the previous artwork pertains to the fabrication of $MgB_2$ superconducting wire differs greatly in fabrication from the application by Rey. The patent application US 20020198111 by Tomsic uses a metallurgical process to fabricate superconducting $MgB_2$ wire. The basic $MgB_2$ wire fabrication process in the patent application US 20020198111 by Tomsic uses a flat metallic strip in which $MgB_2$ powder is dispersed. The flat metallic strip is then rolled up and set through a series of dies and heat treats to form the final superconducting $MgB_2$ wire. Nowhere in the process described by the patent application US 20020198111 by Tomsic is the use of a non-superconducting high temperature fiber, a non-superconducting buffer layer, the need to promote textured growth, or thin or thick film deposition. It is a completely different manufacture process with fabrication similarities.

The application by Rey is far different in that a NON-SUPERCONDUCTING high temperature fiber (e.g. Ti, SiC, Aluminum oxide, etc.) is coated with magnesium di-boride film using one of the well known thick film (dip coating, sol-gel, spray/spin coat, etc.) or thin film (CVD, RF/DC sputter, e-beam, PLD, etc.) deposition techniques. The fiber in the application by Rey is NON-SUPERCONDUTCING and must be able to handle the extremely high reactions temperatures to form the $MgB_2$ superconducting phase. Furthermore, the fiber in the application by Rey most promote good grain alignment and was specifically chosen to be of a similar crystal structure (hexagonal) as the $MgB_2$ to promote textured crystal growth of the $MgB_2$.

US 20020173428

The patent application by Rey cites the related prior patent application US 20020173428 by Thieme et al. US 20020173428 by Thieme et al. is the closest in prior artwork to the patent application by Rey, however, substantial differences still remain particularly in the selection of the non-superconducting high temperature fiber and the fabrication of the layered superconductor. In the patent application by Rey choice of the high temperature fiber is crucial is obtaining high quality superconducting material. The fiber must be chosen so that is promotes good grain alignment, reduces CTE mismatch, provides the necessary lattice matching. High temperature fibers such as SiC, WC, $Al_2O_3$, Ti, are specifically chosen for several reasons. First, they have a similar hexagonal crystal structure. Second, they are strong, lightweight, low-cost, and compliant. Finally, they are able to withstand the high reactions temperature while remaining chemically inert. These fiber templates are not recognized by Thieme et al. (see paragraphs 0078). Another discerning difference between the application by Rey and the application US 20020173428 by Thieme is the use of a non-superconducting buffer. The non-superconducting buffer can consist of either a non-conducting or conducing oxide, nitride or boride, or a metallic element or compound. Buffer laye(s) are important for a variety of reasons including: a) their ability to provide chemical barriers which reduce fiber substrate/superconductor contamination during high temperature reaction, b) their ability to reduce mechanical strain caused by CTE mismatch, c) promote crystal lattice constant matching, d) provide a superior template, e) provide electric and thermal stability (conducting buffers only) etc. Another discerning difference between the application by Rey and the application US 20020173428 by Thieme is seen in claim 27 of Thieme et al. Claim 27 specifically refers to a heated surface for its fiber. Two-step ex-situ fabrication processes in which the film deposition occurs at room temperatures and the superconducting phase is formed in a subsequent annealling step(s) are often lower in cost to fabricate than the in-situ heating method described in claim 27 of Thieme et al. This is not a trivial extension of US 20020173428, but instead a substantial improvement in obtaining a more economically viable superconducting wire.

DESCRIPTION OF FIGURES

FIG. 1 shows a typical embodiment of the invention. The central fiber substrate is a non-superconducting high temperature fiber (5). An (optional) metallic coating (10) can be deposited and mechanically textured to improve the textured grain growth as well as improve the electrical and thermal stability of the final superconducting wire itself. To further improve the textured growth of the superconducting material and hence improve the current carrying capacity, an (optional) appropriate crystalline non-superconducting buffer layer (15) or layer(s) can be deposited on the high temperature fiber. The Mg—B material (20) is then deposited on top of the (optional) buffer layer. If necessary, another noble metallic coating (25) can be deposited on top of the Mg—B material to further improve electric and thermal stability. Finally, an appropriate dielectric coating (30) can be deposited in order to provide electrical insulation and environmental protection.

FIG. 2 shows a typical embodiment of a Mg—B thin film deposition technique using ion beam assisted deposition (IBAD) on the proposed high temperature fiber substrate. The central substrate is a high temperature fiber (35). The deposition beam (40) bombards the various targets (45) consisting of various non-superconducting buffer layers and the Mg—B material. The orientation angle (50) of the high temperature fiber substrate relative to the ion assist beam (55) is adjusted to its optimal position. The ion assist is used to improve texture to both the non-superconducting buffer layer(s) and the Mg—B material. The process is carried out in a deposition chamber (60). Other fabrication methods without ion assist (for additional texturing) can also be employed (see Summary of the Invention-paragraph 1).

FIG. 3 is a typical flow chart of Mg—B thin or thick film deposition on the proposed high temperature fiber or tape substrate. The purpose of this figure is to further clarify the information provided in FIG. 2.

Figure 1:
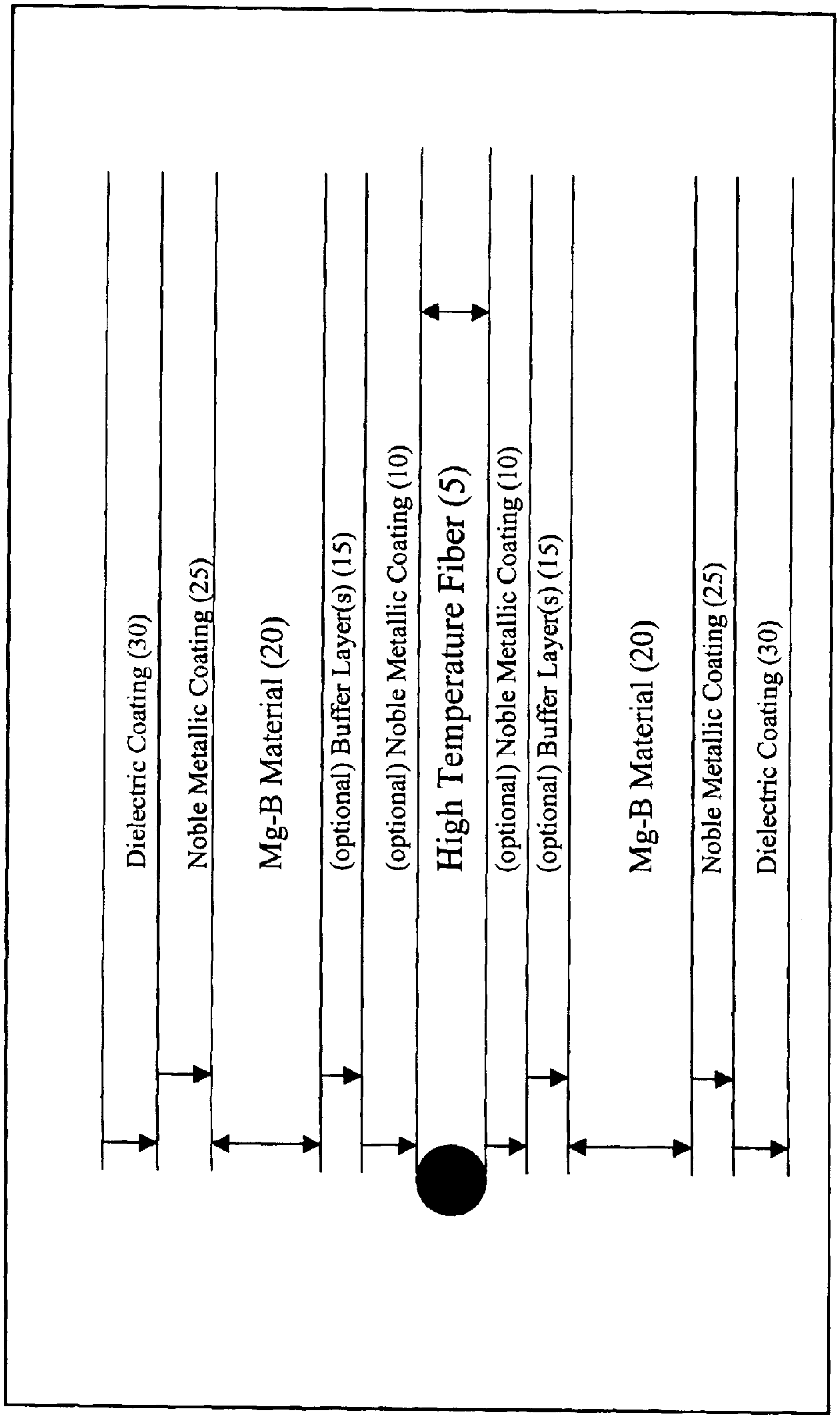
FIG. 1
Figure 2:
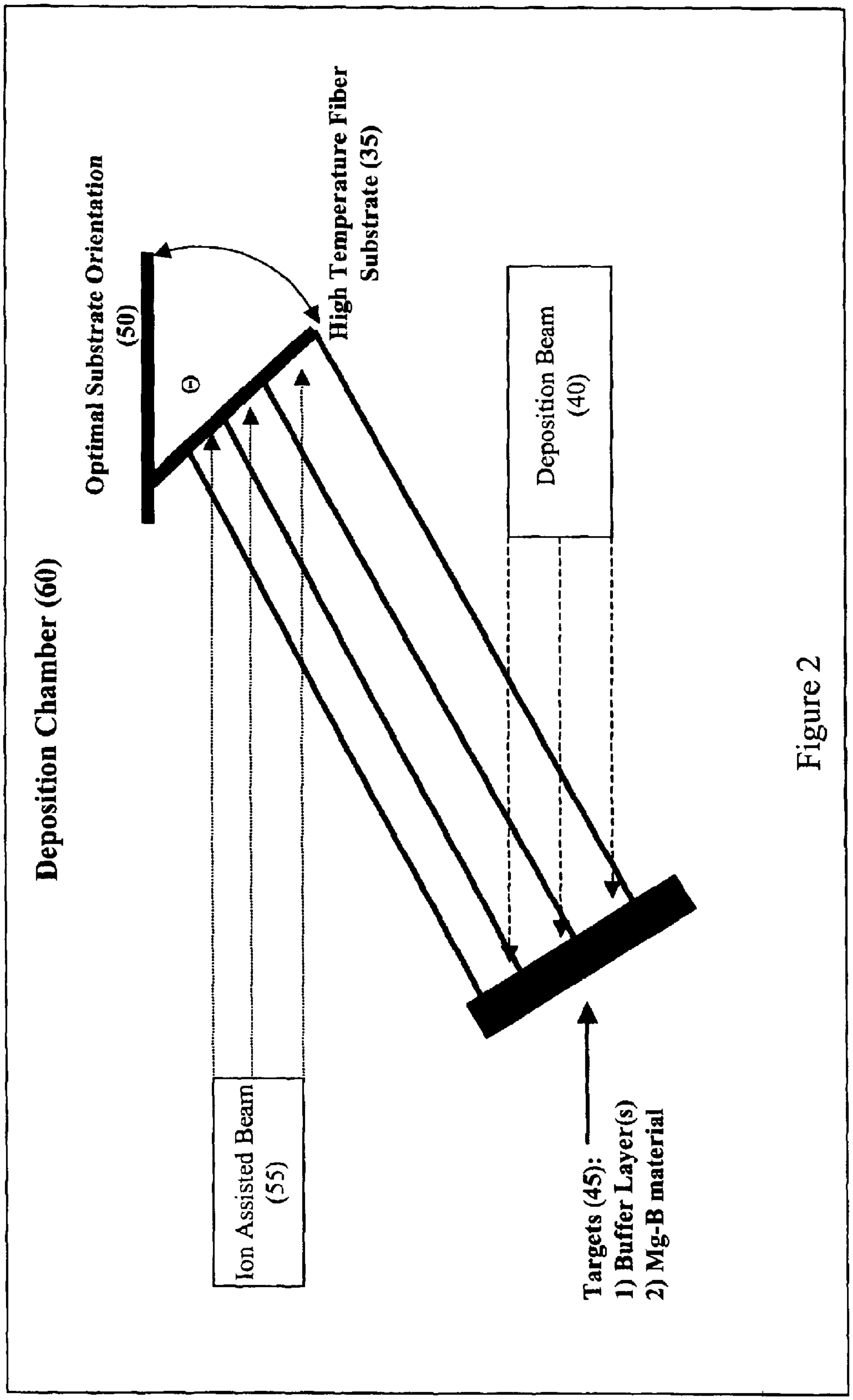
FIG. 2
Figure 3:
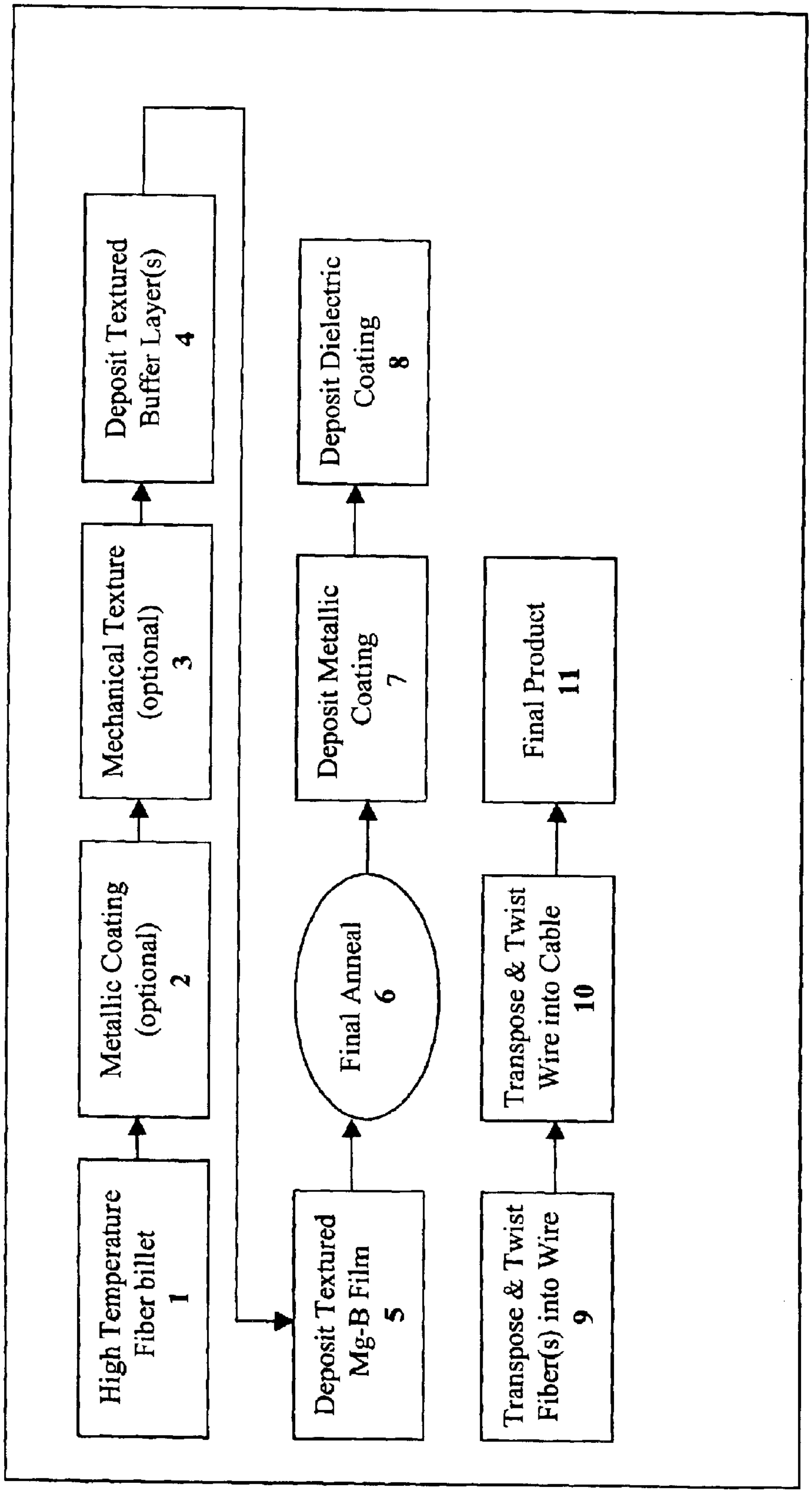
FIG. 3

A typical flow chart of the fabrication process of the present invention is illustrated in FIG. 3. The process begins with the introduction of the non-superconducting high temperature fiber billet/template (SiC, WC, $Al_2O_3$, silica, Ti, etc.) (1). The billet/template consists of fully characterized high temperature fiber or tape of uniform cross section. In the next step of the process (2), a noble metallic coating can be deposited on the high temperature fiber or tape and a texture is applied mechanically via rolling if necessary (3). Some high temperature fiber templates may not need this additional mechanical texturing (e.g. SiC, $Al_2O_3$). In the next step of the process (4), a non-superconducting textured buffer layer(s) is then deposited in a controlled environment (i.e. temperature, pressure, chemical species present, water vapor, etc.) on the high temperature fiber or tape to enhance textured grain growth, provide good lattice matching, prevent chemical incompatibilities, etc. Next (5), the Mg—B material is deposited in a controlled environment on the buffer layer (i.e. temperature, pressure, chemical species present, water vapor, etc.). It is important that the Mg—B material have good c-axis alignment and be as thick as possible without degrading the current carrying capacity of the conductor. Next, the high temperature fibers or tapes can then undergo a final temperature anneal (6). The last processing step, is the introduction of a noble metallic material (7) for electric and thermal stability and/or a dielectric material for electrical insulation and environmental protection (8). The post-processed wire is then transposed, twisted and cabled (9) into multi-strand conductor. The final step (10) is the installation of the cable for device fabrication. If the post-processed high temperature fiber (11) is specifically an optical fiber (silica or sapphire) it may have a plural use as both traditional optical fiber used in optical data transmission and/or a superconducting wire for electrical current carrying devices.

What is claimed is:

1. A superconducting wire or cable consisting of:

multiple textured multilayer film filaments, each having:

a thin non-superconducting high temperature fiber substrate template which has a hexagonal crystal structure a non-superconducting buffer layer or layers upon said fiber substrate a precursor superconducting material of magnesium and boron upon said non-superconducting buffer layer or layers wherein said precursor superconducting material upon said buffer layer or layers has a good crystal lattice match to form a textured multilayered film filament and said multilayer film filaments are stacked, bundled, twisted, and transposed to form a superconducting wire or cable.

2. The superconducting wire or cable of claim 1, wherein said multilayer film filament comprises the basic current carrying element.

3. The superconducting wire or cable of claim 1, wherein said precursor superconducting material is a low temperature superconducting material selected from either a stoichiometric or non-stoichiometric mixture of magnesium boride superconductor.

4. The superconducting wire or cable of claim 1, wherein said precursor superconducting material is a mixture of chemical elements of magnesium boride superconductor chemically doped with other elements such as titanium, niobium, zirconium, tantalum, vanadium, silicon carbide, tungsten, boron nitride, etc. to enhance the critical superconducting properties.

5. The superconducting wire or cable of claim 1, wherein said multilayer film filaments include a noble metallic coating upon said superconducting precursor material to reduce voltage stress and enhance the electric and thermal stability.

6. The superconducting wire or cable of claim 1, wherein said multilayer film filaments include a dielectric coating upon said noble metallic coating to provide electrical insulation and environmental protection.

7. The superconducting wire or cable of claim 1, wherein said multilayer film filaments include physical defects and/or chemical dopants/impurities in said superconducting precursor material to enhance the electromagnetic pinning force which increases the critical current of said multilayer film filament that comprises said superconducting wire or cable.

8. The superconducting wire or cable of claim 1, wherein said high temperature fiber substrate is a crystalline, polycrystalline, amorphous, or metallic fiber capable of surviving the high reaction temperatures necessary to form the superconducting phase of magnesium di-boride without degradation.

9. A superconducting wire or cable consisting of:

multiple textured multilayer film filaments, each having:

a thin non-superconducting high temperature fiber substrate template which has a hexagonal crystal structure a precursor superconducting material of magnesium and boron upon said high temperature fiber substrate wherein said precursor superconducting material upon said high temperature fiber substrate has a good crystal lattice match to form a textured multilayered film filament and said multilayer film filaments are stacked, bundled, twisted, and transposed to form a superconducting wire or cable.

10. The superconducting wire or cable of claim 9, wherein said multilayer film filament comprises the basic current carrying element.

11. The superconducting wire or cable of claim 9, wherein said precursor superconducting material is a low temperature superconducting material selected from either a stoichiometric or non-stoichiometric mixture of magnesium boride superconductor.

12. The superconducting wire or cable of claim 9, wherein said precursor superconducting material is a mixture of chemical elements of magnesium boride superconductor chemically doped with other elements such as titanium, niobium, zirconium, tantalum, vanadium, silicon carbide, tungsten, boron nitride, etc. to enhance the critical superconducting properties.

13. The superconducting wire or cable of claim 9, wherein said multilayer film filaments include a noble metallic coating upon said superconducting precursor material to reduce voltage stress and enhance the electric and thermal stability.

14. The superconducting wire or cable of claim 9, wherein said multilayer film filaments include a dielectric coating upon said noble metallic coating to provide electrical insulation and environmental protection.

15. The superconducting wire or cable of claim 9, wherein said multilayer film filaments include physical and/or chemical defects in said superconducting precursor material to enhance the electromagnetic pinning force which increases the critical current of said multilayer film filament that comprises the said superconducting wire or cable.

16. The superconducting wire or cable of claim 9, wherein said high temperature fiber substrate is a crystalline, polycrystalline, amorphous, or metallic fiber capable of surviving the high reaction temperatures necessary to form the superconducting phase of magnesium di-boride without degradation.

* * * * *